United States Patent [19]

Kubota et al.

[11] Patent Number: 5,068,588
[45] Date of Patent: Nov. 26, 1991

[54] APPARATUS FOR MOUNTING A FLAT PACKAGE TYPE IC

[75] Inventors: Hitoshi Kubota, Moriguchi; Manabu Yamane, Neyagawa; Takashi Anezaki, Hirakata, all of Japan

[73] Assignee: Matsushita Electric Industrial Co., Ltd., Osaka, Japan

[21] Appl. No.: 452,909

[22] Filed: Dec. 19, 1989

[30] Foreign Application Priority Data

Dec. 20, 1988 [JP] Japan .................. 63-321189

[51] Int. Cl.$^5$ ............................................. G05B 1/06
[52] U.S. Cl. ..................... 318/640; 318/377; 356/400; 250/561
[58] Field of Search ............. 318/560, 561, 478, 601, 318/603, 577, 587, 636, 640, 632; 356/400; 250/561, 548, 211 J

[56] References Cited

U.S. PATENT DOCUMENTS

| | | | |
|---|---|---|---|
| 4,146,924 | 3/1979 | Birk et al. | 318/640 X |
| 4,187,051 | 2/1980 | Kirsch et al. | 318/640 X |
| 4,301,470 | 11/1981 | Pagany | 356/400 X |
| 4,315,201 | 2/1982 | Suzuki et al. | 318/640 |
| 4,333,044 | 6/1982 | Blitchington | 250/561 X |
| 4,342,090 | 7/1982 | Caccoma et al. | 318/640 X |
| 4,412,121 | 10/1983 | Kremers et al. | 318/577 X |
| 4,425,537 | 1/1984 | Philips et al. | 318/640 |
| 4,442,388 | 4/1984 | Philips | 318/640 |
| 4,531,060 | 7/1985 | Suwa et al. | 356/400 X |
| 4,613,942 | 9/1986 | Chen | 250/561 X |
| 4,622,502 | 11/1986 | Maruo et al. | 318/640 |
| 4,628,464 | 12/1986 | McConnell | 364/513 |
| 4,664,524 | 5/1987 | Hattori et al. | 356/400 X |
| 4,687,980 | 8/1987 | Philips et al. | 318/640 |
| 4,720,635 | 1/1988 | Uga | 356/400 X |
| 4,845,373 | 7/1989 | Jamieson et al. | 356/400 X |
| 4,861,162 | 8/1989 | Ina | 356/400 X |
| 4,870,452 | 9/1989 | Tanimoto et al. | 356/400 X |
| 4,871,955 | 10/1989 | Berger | 318/577 X |

FOREIGN PATENT DOCUMENTS 0222072 5/1987 European Pat. Off. .

OTHER PUBLICATIONS

Shima, Yoshihiro et al., "Automatic Position Detection Method for Mounting IC Parts on High-Density Printed Circuit Boards", *Systems and Computers in Japan*, vol. 17, No. 10, 1986, pp. 66–77.

Primary Examiner—Paul Ip
Attorney, Agent, or Firm—Panitch Schwarze Jacob & Nadel

[57] ABSTRACT

An apparatus for mounting a flat package type IC on a printed circuit board is disclosed. The apparatus includes: a robot hand for holding the IC; cameras each for taking an image of a part of the IC taking an image of a part of the board, which cameras are fixed to the hand and arranged symmetrically with respect to the rotation axis of the hand; a first processor for obtaining linear deviation and rotational deviation of leads from the images of the IC, and for obtaining linear deviations and rotational deviation of lands from the images of the board; a second processor for obtaining a linear difference between the linear deviations of the IC and board, and for obtaining a rotational difference between the rotational deviations of the IC and board; and a driver for adjusting the position of the IC, by linearly moving the hand by the linear difference, and by rotating the hand by the rotational difference, thereby correctly positioning the leads on the corresponding lands.

4 Claims, 11 Drawing Sheets

APPARATUS FOR MOUNTING A FLAT PACKAGE TYPE IC

BACKGROUND OF THE INVENTION

1. Field of the Invention:

This invention relates to an apparatus for mounting a flat package type IC on a printed circuit board, and more particularly to an apparatus for automatically mounting a flat package type IC on a printed circuit board.

2. Description of the Prior Art:

Recently, digitized electronic apparatuses have began to be mass-produced, with the expanded demand for the miniaturization and high performance electronic apparatus. In many of such apparatuses, flat package type ICs of large scale and high integration degree are mounted on a printed circuit board (hereinafter, abbreviated as "PCB"). Attempts to automatize the process of mounting a flat package type IC on a PCB have been conducted. However, it is difficult to automatically mount a flat package type IC of large scale (number of leads: 100 to 400) and high integration degree (lead interval: 0.6 to 0.4 mm).

FIG. 10 illustrates a prior art apparatus of automatically mounting a flat package type IC in which apparatus an industrial robot is used. In the apparatus of FIG. 10, a feed station 21, a lead recognition station 22, a mount station 24, and a land recognition station 26 are arranged along the orbit 23 of an industrial robot (not shown). An IC to be mounted is fed to the feed station 21, and is securely held by a hand of the industrial robot. The lead recognition and land recognition stations 22 and 26 are respectively provided with a camera (not shown) which is fixed to a predetermined position. A PCB to which the IC is mounted is placed on an XY table 25 which moves from the land recognition station 26 to the mount station 24. The PCB held by the robot is transferred from the part feed station 21 to the lead recognition station 22, then the camera of the station 22 shoots the IC to obtain an entire image 32 of leads of the IC (FIG. 11). On the other hand, the camera of the land recognition station 26 shoots the PCB to obtain an entire image 33 of lands of the PCB (FIG. 12).

The two images 32 and 33 are processed by a known image processing technique to obtain a relative positional relation between a specific lead and the corresponding land. In FIGS. 11 and 12, an image coordinate 31, a rotational deviation $\Delta\theta_a$ of the lead from the X-coordinate, and a rotational deviation $\Delta\theta_b$ of the land from the X-coordinate are shown. From the obtained positional relation, the linear correction component and rotational correction component of the movement of the robot hand are calculated. Then, both the IC held by the robot hand and PCB placed on the XY table 25 are transferred to the mount station 24, and the IC is placed on the PCB to be mounted thereon. In this process, the movement of the robot hand holding the IC is corrected in accordance with the calculated linear and rotational correction components, so that leads are suitably positioned with respect to corresponding lands.

The above-mentioned prior art apparatus may conduct adequately a mount process for a flat package type IC of relatively small scale or low integration degree, but cannot mount a flat package type IC of large scale and high integration degree because this apparatus cannot provide an entire image of leads of such a relatively large scale IC.

This problem in a prior art apparatus may be overcome by disposing a plurality of cameras at the lead recognition station 22. Even if an entire image of leads can be obtained by combining several camera images, it is still difficult to obtain accurately the linear correction component and rotational correction component of the movement of the robot hand, because such a large scale IC has a large number of leads. Moreover, leads are not always oriented in the predetermined directions, resulting in that an accurate mount is not performed only by one linear and rotational correction. This also applies to lands of a PCB on which a large scale IC is to be mounted.

When a large scale IC is mounted on a PCB, further, many precise processes including other various inspections such as those on the bend, alignment and number of leads must be conducted. It is impossible to conduct these processes by a prior art apparatus such as shown in FIG. 10.

SUMMARY OF THE INVENTION

The apparatus for mounting a flat package type IC of this invention, which overcomes the above-discussed and numerous other disadvantages and deficiencies of the prior art, comprises a holding means for holding the IC, said holding means being capable of moving at least in a horizontal plane and rotating about an axis; a plurality of cameras each for taking an image of a part of the IC which are held by said holding means, and each for taking an image of a part of the board, said cameras being fixed to said holding means and arranged symmetrically with respect to said axis; a first process means for obtaining linear deviation and rotational deviation of leads from said images of the IC, and for obtaining linear deviations and rotational deviation of lands from said images of the board; a second process means for obtaining a linear difference between said linear deviations of the IC and board, and for obtaining a rotational difference between said rotational deviations of the IC and board; and an adjusting means for adjusting the position of the IC held by said hand, by linearly moving said hand by said linear difference, and by rotating said hand by said rotational difference, thereby correctly positioning the leads on the corresponding lands.

In a preferred embodiment, the second process means obtains said linear and rotational differences, using a statistical technique.

In a preferred embodiment, the apparatus further comprises: a memory means for storing the previously obtained relationship between the maximum linear deviation and the rotation angle of said hand; a third process means for obtaining a rotation angle corresponding to the obtained linear difference, from said relationship; and a further adjusting means for repeatingly adjusting the position of the IC held by said hand, by rotating said hand by said rotation angle until the obtained linear difference is less than a predetermined allowable value, thereby more correctly positioning the leads on the corresponding lands.

According to the invention, a method of positioning two or more cameras symmetrically with respect to a rotation axis of a hand of a robot for mounting a flat package type IC on a printed circuit board is provided. The method comprises the steps of: (a) attaching provisionally said cameras to said hand; (b) taking an image of a reference plate by two of said cameras, said two cameras being adjacent to each other; (c) obtaining a characteristic value from each of said images; (d) obtaining the difference between said characteristic values; (e) adjusting the position of at least one of said two cameras; and (f) repeating steps (b) to (e) until said difference becomes smaller than a predetermined value.

Thus, the invention described herein makes possible the objectives of (1) providing an apparatus for automatically mounting a flat package type IC of large scale and high integration degree on a PCB; (2) providing an apparatus for automatically mounting a flat package type IC of large scale and high integration degree on a PCB by which apparatus leads of the IC can be accurately positioned with respect to the lands of the PCB; (3) providing an apparatus for automatically mounting a flat package type IC of large scale and high integration degree on a PCB in which apparatus it is not required to provide a land recognition station; and (4) providing a method of positioning two or more cameras symmetrically with respect to a rotation axis of a hand of an industrial robot.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
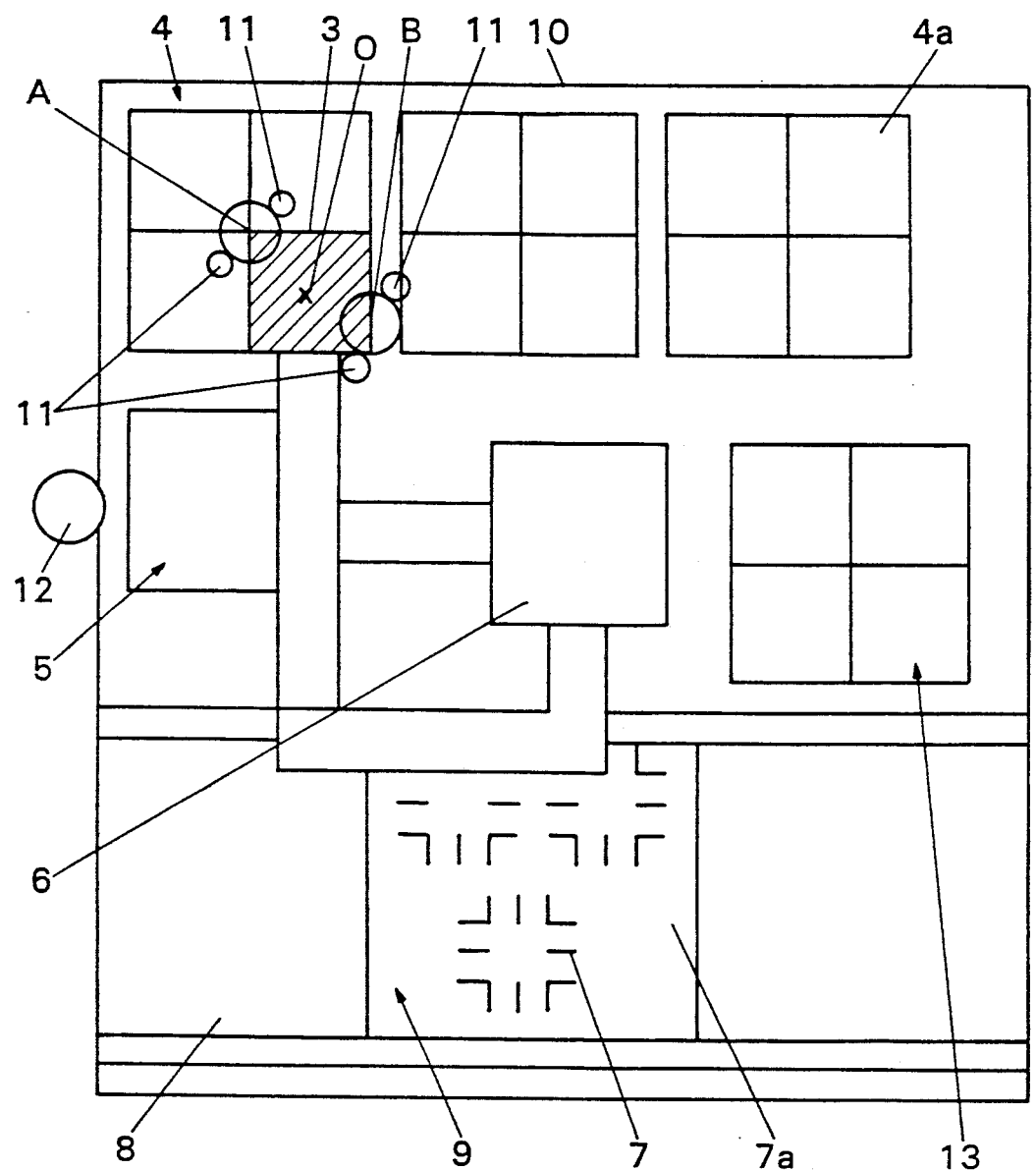
FIG. 1 is a diagrammatic plan view of an apparatus according to the invention.

FIG. 1 is a plan view showing an apparatus according to the invention. The apparatus shown in FIG. 1 comprises a feed station 4, a lead recognition station 5, a positioning station 9, an inferior-IC disposal station 13, and an industrial robot 6 of a horizontally articulate type having four degrees of freedom. These stations and the robot are arranged on a pedestal 10, and their operations are controlled by a computer (not shown). The robot 6 has a hand 3 which can rotate about a shaft 0 (hereinafter, referred to as "specific shaft" or "center of cameras"), two cameras A and B, and four lamps 11 attached to the hand 3. The two cameras A and B are fixed to the hand 3 in such a manner that they are symmetrical with respect to the specific shaft 0. The apparatus of FIG. 1 further comprises another camera 12 disposed at the side of the lead recognition station 5. The camera 12 is directed so as to obtain a side view of an IC (i.e., a side view of leads). Images taken by the cameras A, B and 12 are transmitted in the form of electric signals to the computer. Trays 4a on which flat package type ICs to be mounted are placed are transferred on the pedestal 10 to convey the ICs into the feed station 4. A PCB 7a on which an IC is to be mounted is carried on a conveyer 8 to reach the positioning station 9.

Figure 2:
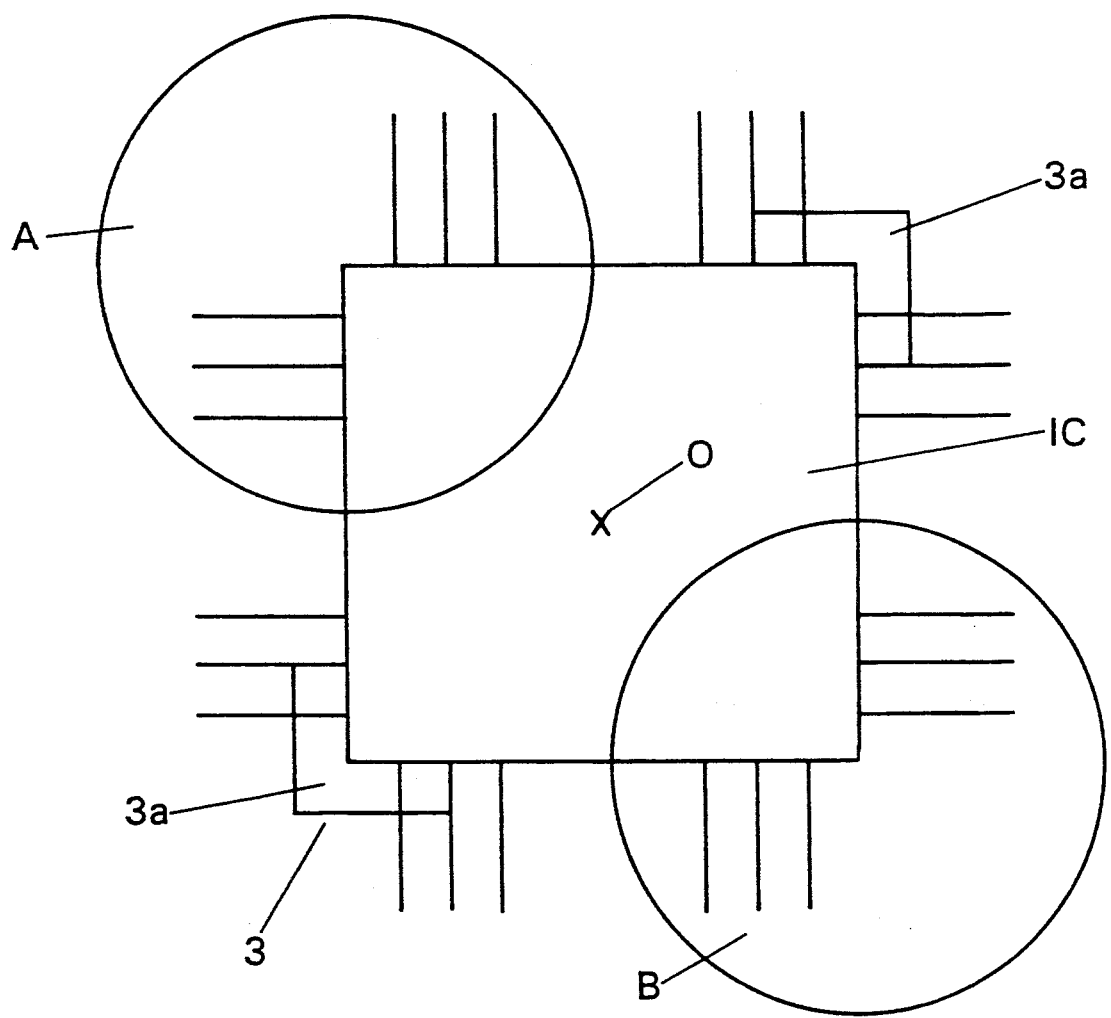
FIG. 2 is a plan view for illustrating the position of cameras.

First, the operation of the apparatus of FIG. 1 will be roughly described. The hand 3 of the robot 6 holds a flat package type IC on a tray 4a by chucks 3a, as shown in FIG. 2, and transfers the IC from the feed station 4 to the lead recognition station 5. At the lead recognition station 5, images which are partial plan views of the leads of the IC are produced by the two cameras A and B, and images which are side views of the leads by the camera 12. From the obtained images, the number of leads, the degree of lead intervals and bends of leads are detected, and, if any of them fails to satisfy the predetermined standards, the IC is judged to be faulty and disposed at the station 13. After the images are obtained, the hand 3 rotates by 90°, and images are obtained in the same way. In each direction, a CP (Continuous Path) control is conducted. This is repeated until the inspection for all the leads of the IC is completed. The linear correction component and rotational correction component of the leads with respect to the center of cameras O are calculated from the images taken by the cameras A and B.

Then, the hand 3 of the robot 6 moves to the positioning station 9 so that the IC held by the hand 3 is provisionally positioned on the corresponding lands 7 of the PCB. Thereafter, images of the lands 7 of the PCB are obtained by the cameras A and B. On the basis of the obtained images of lands 7, the position of lands, the number of lands, the degree of land intervals are inspected, and the linear correction component and rotational correction component of the lands 7 with respect to the center of cameras O are calculated. Thereafter, the difference (linear difference) between the linear correction components of the leads and lands, and the difference (rotational difference) between the rotational correction components of the leads and lands are calculated. The hand 3 is linearly moved by the amount of the linear difference, and is rotated about the specific shaft O by the amount of the rotational difference, thereby accurately positioning the leads on the corresponding lands.

The operation of the apparatus in the case where the IC to be mounted has 21×31 leads will be described in more detail.

(a) Deviations of leads

Figure 3:
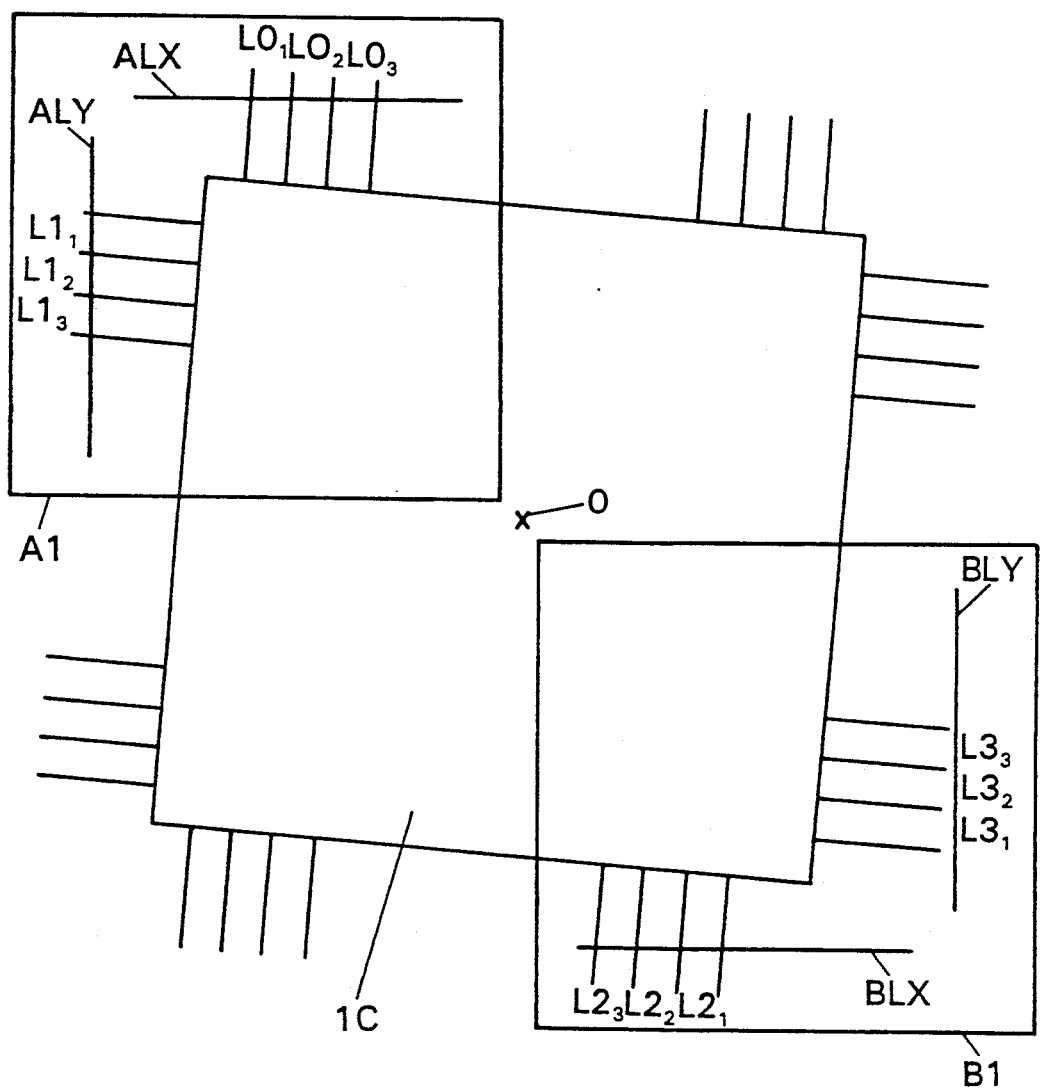
FIG. 3 shows images of leads of an IC taken by two cameras of the apparatus of FIG. 1.

FIG. 3 shows the images of leads obtained at the lead recognition station 5. In FIG. 3, A1 indicates the image obtained by the camera A, and B1 the image obtained by the camera B. In the image A1, lead-recognition lines ALX and ALY are previously set. The lead-recognition line ALX elongates along the X-direction of the XY coordinate in the image A1 (i.e., the Y-coordinate of the line ALX is constant), and the lead-recognition line ALY elongates along the Y-direction (i.e., the X-coordinate of the line ALY is constant). The image A1 is processed by a known image processing technique. As a result of the image process, the X-coordinates of the intersections of the lead-recognition line ALX and the images of leads appearing in the image A1 are obtained as pixel values (L0$_1$, L0$_2$, - - -, L0$_P$), and the Y-coordinates of the intersections of the lead-recognition line ALY and the images of leads appearing in the image A1 are obtained as pixel values (L1$_1$, L1$_2$, - - -, L1$_Q$), wherein "P" and "Q" are the number of leads intersecting with the lines ALX or ALY, respectively.

In the image B1, similarly, lead-recognition lines BLX and BLY are previously set. The X-coordinates of the intersections of the lead-recognition line BLX and the images of leads appearing in the image B1 are obtained as pixel values (L2$_1$, L2$_2$, - - -, L2$_R$), and the Y-coordinates of the intersections of the lead-recognition line BLY and the images of leads appearing in the image B1 are obtained as pixel values (L3$_1$, L3$_2$, - - -, L3$_S$), wherein "R" and "S" are the number of leads intersecting with the lines BLX or BLY, respectively.

Then, in order to obtain linear deviations (DL$_X$, DL$_Y$) of leads from the center of cameras O, calculations for pairing pixel values of the images A1 and B1 are connected in the following manner. If one or either of paired images has been judged not to satisfy the requirements, the calculation for this pair is not conducted. In the embodiment, the resolution of the cameras A and B is 512 pixels in X-direction and 480 pixels in Y-direction.

Pairing of leads in X-direction $$DLX_1 = LO_1 - (512 - L2_1)$$
$$DLX_2 = LO_2 - (512 - L2_2)$$
$$DLX_3 = LO_3 - (512 - L2_3)$$
$$\vdots$$
$$DLX_N = LO_N - (512 - L2_N)$$

"N" is the number of pairs of leads which have been judged faultless in the above.

Pairing of leads in Y-direction $$DLY_1 = L1_1 - (480 - L3_1)$$
$$DLY_2 = L1_2 - (480 - L3_2)$$
$$DLY_3 = L1_3 - (480 - L3_3)$$
$$\vdots$$
$$DLY_M = L1_M - (480 - L3_M)$$

"M" is the number of pairs of leads which have been judged faultless in the above.

The linear deviation of the leads is obtained from the following expressions.

$$DL_X = (DLX_1 + DLX_2 + \ldots DLX_N)/2N$$

$$DL_Y = (DLY_1 + DLY_2 + \ldots DLY_M)/2M$$

Figure 5:
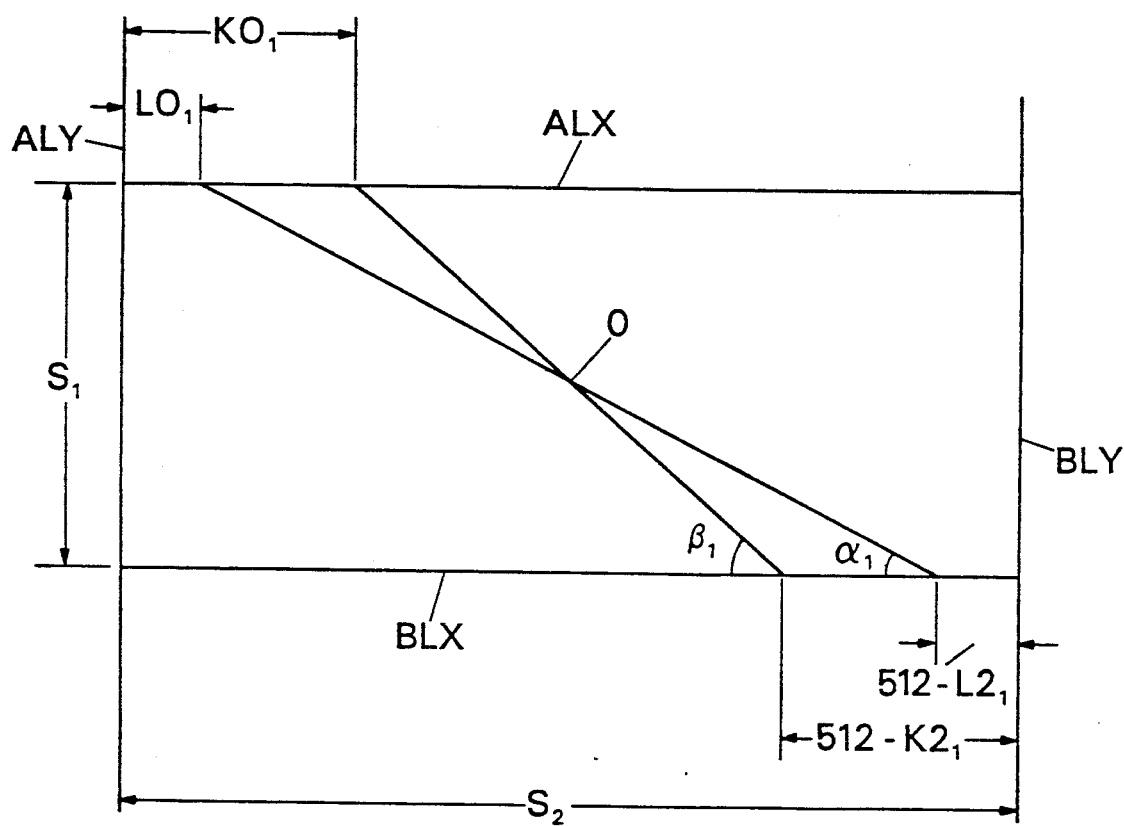
FIG. 5 is a diagram for illustrating the principle used in obtaining a rotational deviation.

Next, the rotational deviation DLZ of the leads from the center of cameras O is calculated. In this calculation, the distance S$_1$ between the lines ALX and BLX, the distance S$_2$ between the lines ALY and BLY, the correct pixel values K0$_n$ and K2$_n$ (n is an integer ranging from 1 to N) are used. The distances S$_1$ and S$_2$ are previously set. The values K0$_n$ and K2$_n$ are the pixel values obtained an IC which has been held by the hand 3 without any deviation, and are previously stored in a memory. FIG. 5 illustrates schematically the principle of the calculation.

$$\alpha_1 = TAN^{-1} \frac{S_1}{S_2 - (L0_1 + (512 - L2_1))}$$

$$\beta_1 = TAN^{-1} \frac{S_1}{S_2 - (K0_1 + (512 - K2_1))}$$

$$DLZ_1 = \beta_1 - \alpha_1$$

Similarly, $$\alpha_2 = TAN^{-1} \frac{S_1}{S_2 - (L0_2 + (512 - L2_2))}$$

$$\beta_2 = TAN^{-1} \frac{S_1}{S_2 - (K0_2 + (512 - K2_2))}$$

$$DLZ_2 = \beta_2 - \alpha_2$$

$$\alpha_N = TAN^{-1} \frac{S_1}{S_2 - (L0_N + (512 - L2_N))}$$

$$\beta_N = TAN^{-1} \frac{S_1}{S_2 - (K0_N + (512 - K2_N))}$$

$$DLZ_N = \beta_N = \alpha_N$$

$$DLZ = (DLZ_1 + DLZ_2 + \ldots DLZ_N)/N$$

(b) Deviation of lands

Figure 4:
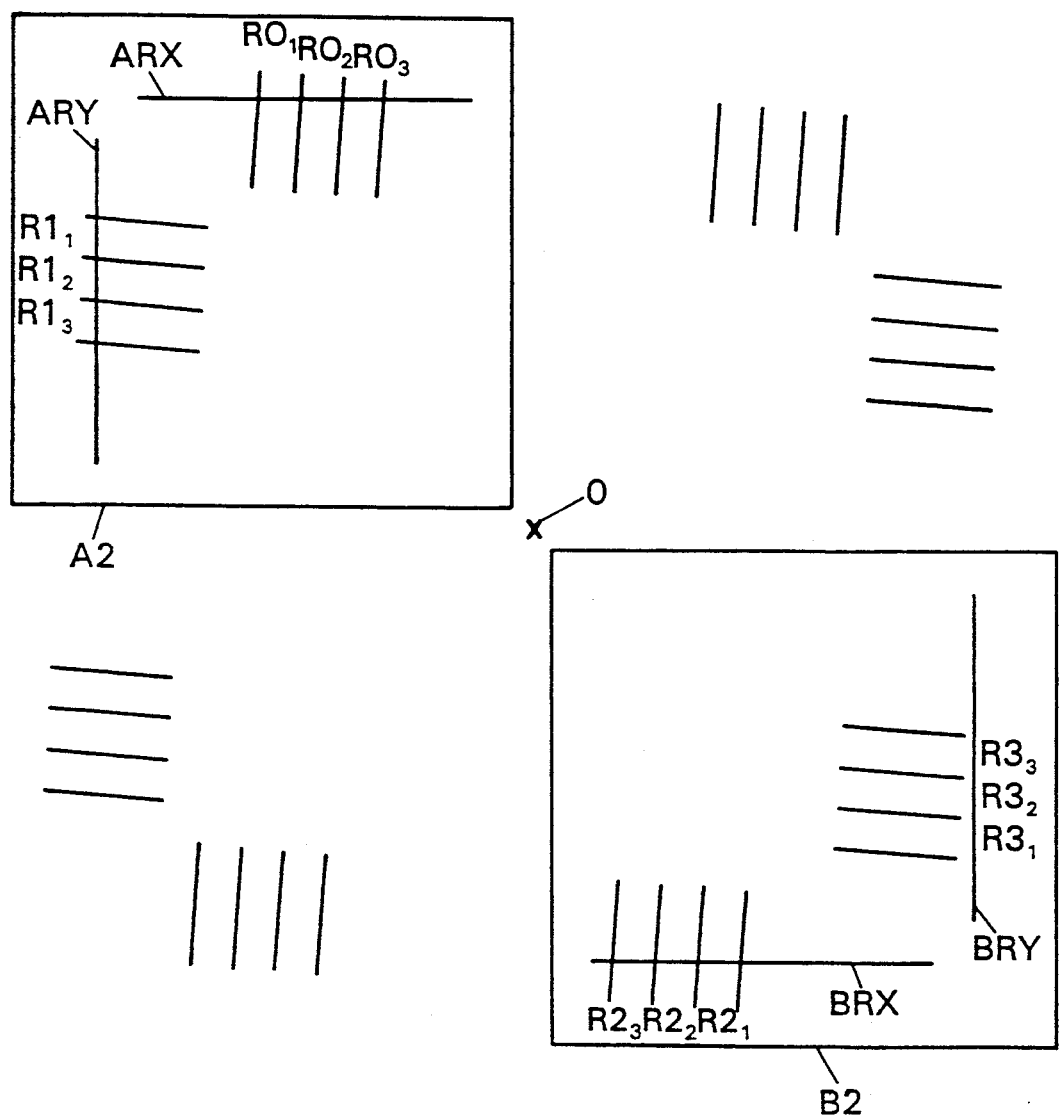
FIG. 4 shows images of lands of a printed circuit board taken by two cameras of the apparatus of FIG. 1.

FIG. 4 shows the images of lands obtained at the positioning station 9. In FIG. 4, A2 indicates the image obtained by the camera A, and B2 the image obtained by the camera B. In the image A2, land-recognition lines ARX and ARY are previously set. The land-recognition line ARX elongates along the X-direction of the XY coordinate in the image A2, and the land-recognition line ARY elongates along the Y-direction. In actual images, the leads of the IC are also shown. In the images A2 and B2 in FIG. 4, however, the leads are not indicated for the sake of simplicity. In order to facilitate the recognition of the intersections, it is preferable that the Y-coordinates of the lines ARX and BRX and the X-coordinates of the lines ARY and BRY are set so as to be slightly different from those of the lines ALX, BLX, ALY and BLY.

The image A2 is processed by the image processing technique. As a result of the image process, the X-coordinates of the intersections of the land-recognition line ARX and the images of lands appearing in the image A2 are obtained as pixel values (R0$_1$, R0$_2$, - - -, R0$_U$), and the Y-coordinates of the intersections of the land-recognition line ARY and the images of lands appearing in the image A2 are obtained as pixel values (R1$_1$, R1$_2$, - - -, R1$_V$), wherein "U" and "V" are the number of lands intersecting with the lines ARX or ARY, respectively.

In the image B2, land-recognition lines BRX and BRY are previously set. The X-coordinates of the intersections of the land-recognition line BRX and the images of lands appearing in the image B2 are obtained as pixel values (R2$_1$, R2$_2$, - - -, R2$_W$), and the Y-coordinates of the intersections of the land-recognition line BRY and the images of lands appearing in the image B2 are obtained as pixel values (R3$_1$, R3$_2$, - - -, R3$_Z$), wherein "W" and "Z" are the number of lands intersecting with the lines BRX or BRY, respectively.

In the similar manner as the above (a), the linear deviations DRX and DRY, and the rotational deviation DRZ of lands are calculated.

(c) Linear correction and rotational correction

From the results obtained in (a) and (b), the difference between the linear deviations DLX and DRX (i.e., DLX−DRX) and that between the linear deviations DLY and DRY (i.e., DLY−DRY) are calculated and stored in a memory as the X-component and Y-component of the linear correction, and the difference between the rotational deviations DLZ and DRZ (i.e., DLZ−DRZ) is calculated to be stored as the component of the rotational correction. The hand 3 of the robot 6 is moved linearly in the X-direction by the value of the X-component, and in the Y-direction by the value of the Y-component. As a result of such adjustments, the leads of the IC can be accurately positioned on the corresponding lands of the PCB.

Figure 6:
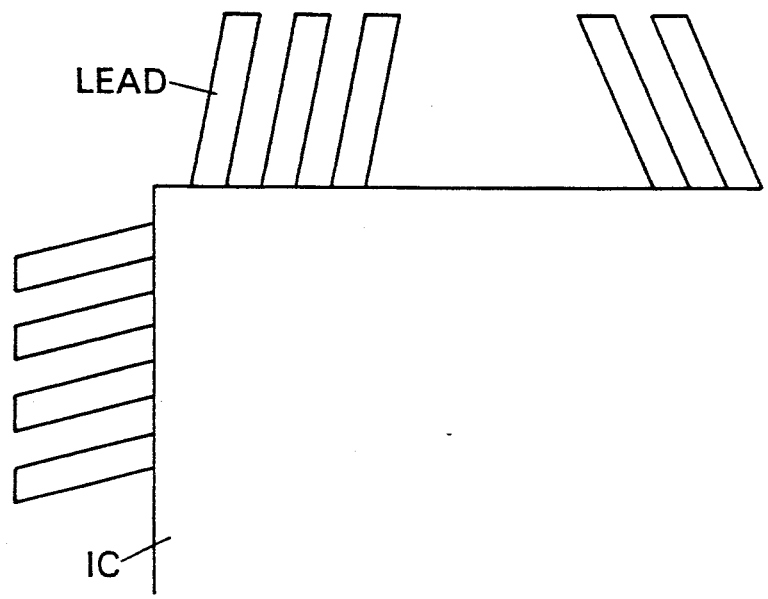
FIG. 6 is an enlarged partial plan view of an IC having unevenly oriented leads.
Figure 7:
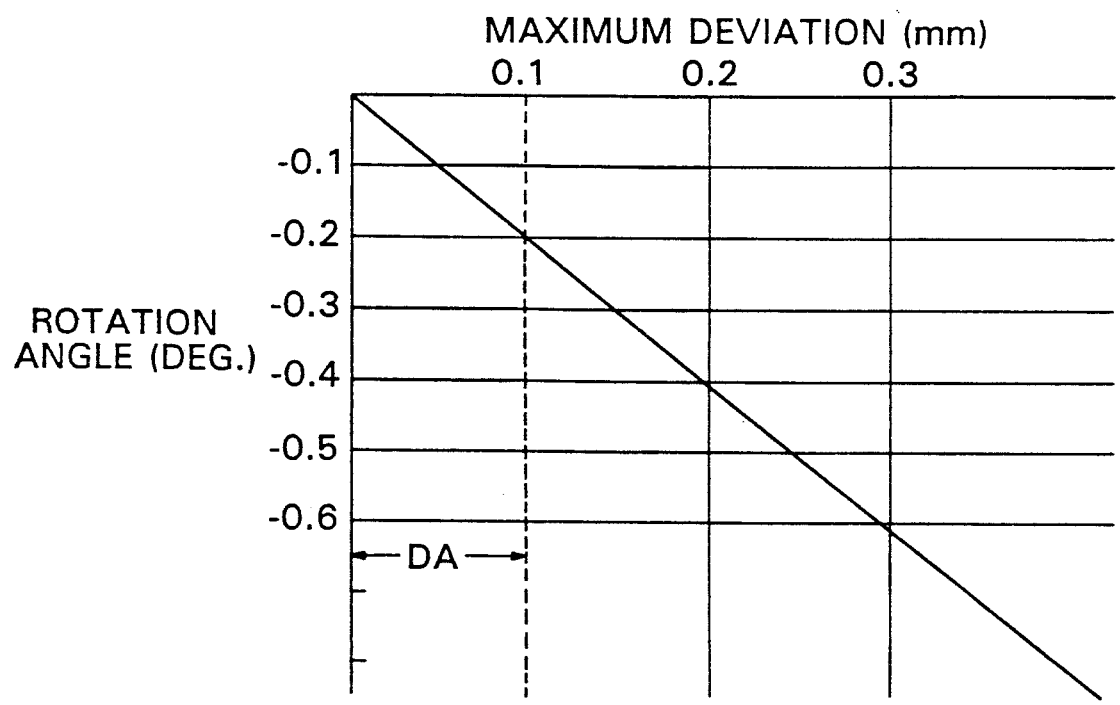
FIG. 7 is a graph showing the relationship between linear deviation and the rotation angle of a hand holding an IC.

In an actual mounting process, there are sometimes cases in which the accurate positioning of leads cannot be accomplished by a linear transformation of the coordinate including the linear correction and rotation correction. For example, when the number of leads is very large (300 to 400), it is often found that leads are not uniformly directed as shown in FIG. 6, resulting in that adjustments using values which are obtained from typical leads and lands is insufficient for correctly positioning all leads. Therefore, it is preferable that the relation between the degree of deviation of leads and the degree of rotation correction of the specific shaft is previously obtained to be stored in the memory of a computer. FIG. 7 shows one example of the relation. In an apparatus according to the invention, an image of a part of lands is obtained just before mounting a flat package type IC on a PCB, and the maximum deviation between the leads and the lands is decided. When the maximum deviation exceeds the allowable range, a rotational angle by which a hand of a robot is to be rotated is calculated from the previously obtained relation, and the hand is rotated about the specific shaft by that angle. These procedures are repeated until leads and lands accurately coincide with each other.

Figure 8:
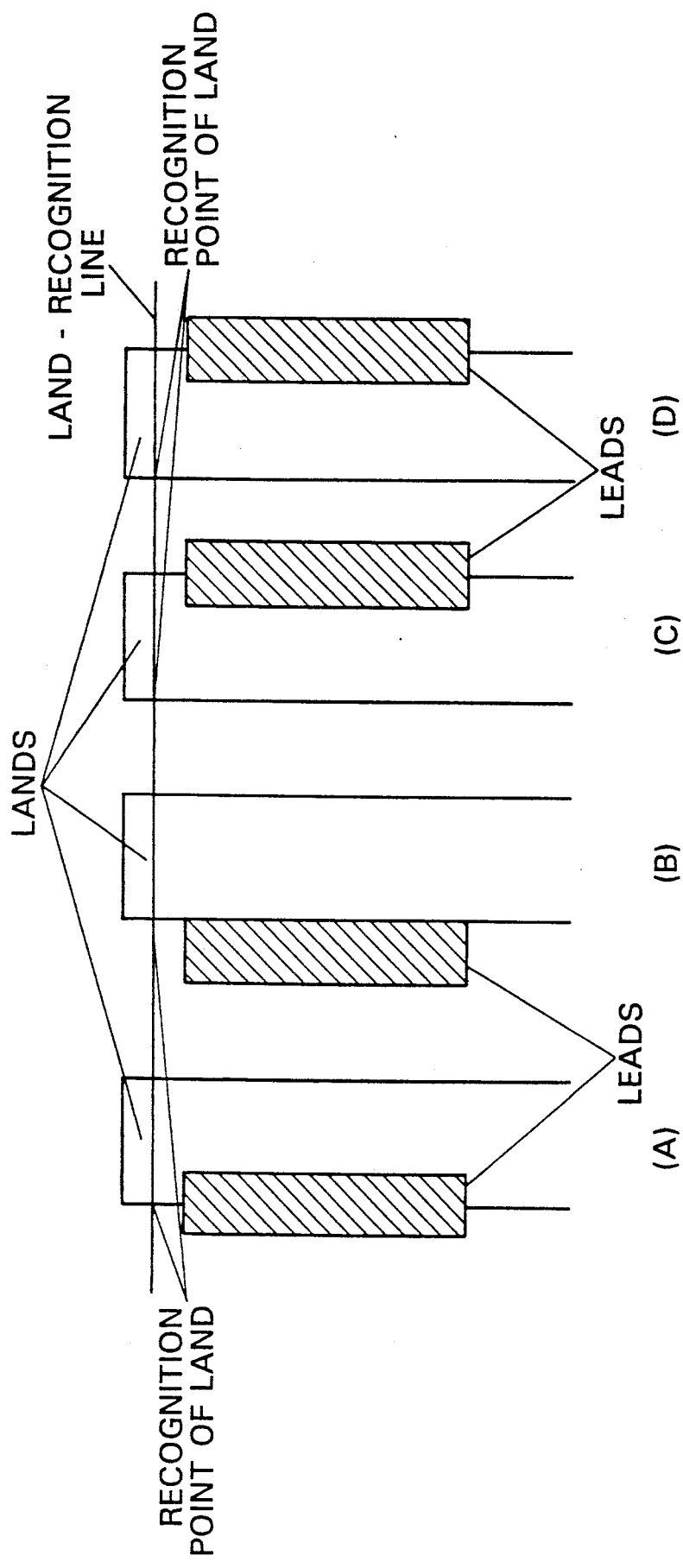
FIG. 8 is a diagram for illustrating the deviation between leads and lands.

The way of deciding the maximum deviation in the embodiment will be described with reference to FIG. 8. In FIG. 8, (A), (C) and (D) are within the allowable range, and (B) exceeds the allowable range. In the embodiment, each combination of a lead and a land is checked one by one. When one combination having a deviation greater than the allowable value (0.100 mm) is detected, the IC is judged faulty.

Since the IC remains held by the hand and the position relative to the hand is unchanged, the image data of the leads obtained in above-mentioned (a) are used in the decision. The image data of the lands are obtained again after above-mentioned (c).

In (A) and (B) of FIG. 8, the maximum deviation can be decided on the basis of the image data of the leads and lands, but, in (C) and (D) of FIG. 8, it is impossible to decide the maximum deviation. Hence, in the embodiment, the width of each lead and that of each land are previously measured and stored in a memory. The coordinate of the right edge of the lead can be obtained by adding the coordinate of the left edge and the width of the lead, so that, even when a land width is different to each other, the coordinate of each land can be obtained in the same manner.

Figure 9:
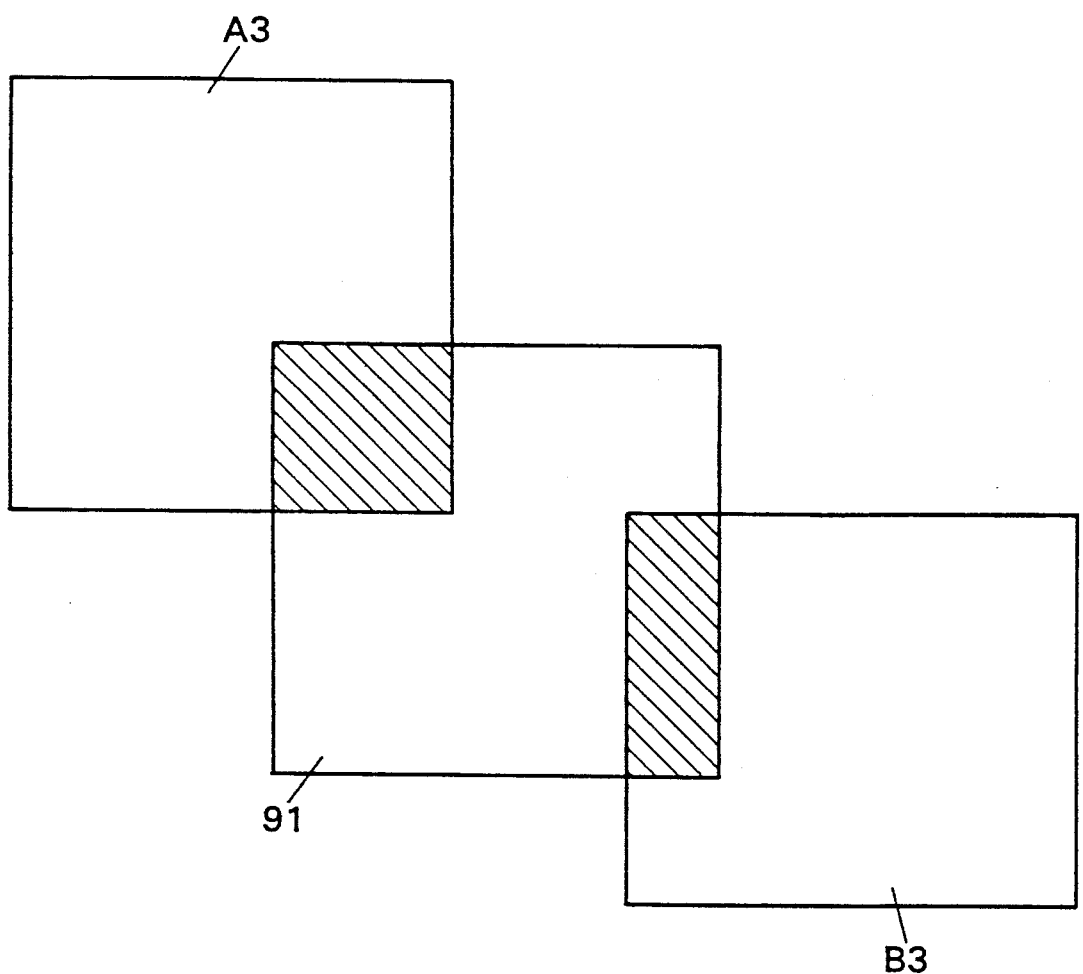
FIG. 9 is a diagrammatic view for illustrating the method of positioning two cameras.
Figure 10:
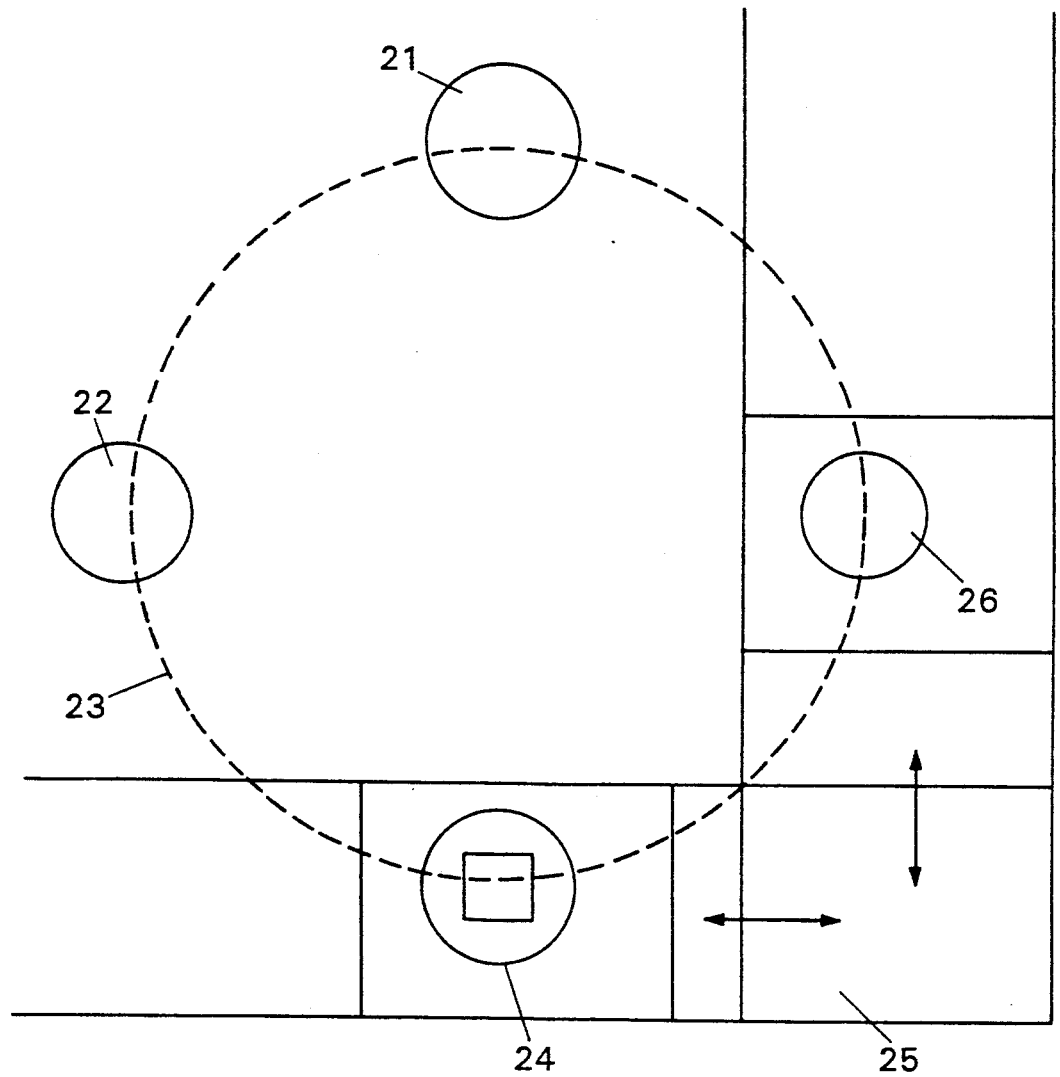
FIG. 10 is a diagrammatic plan view of a conventional apparatus.
Figure 11:
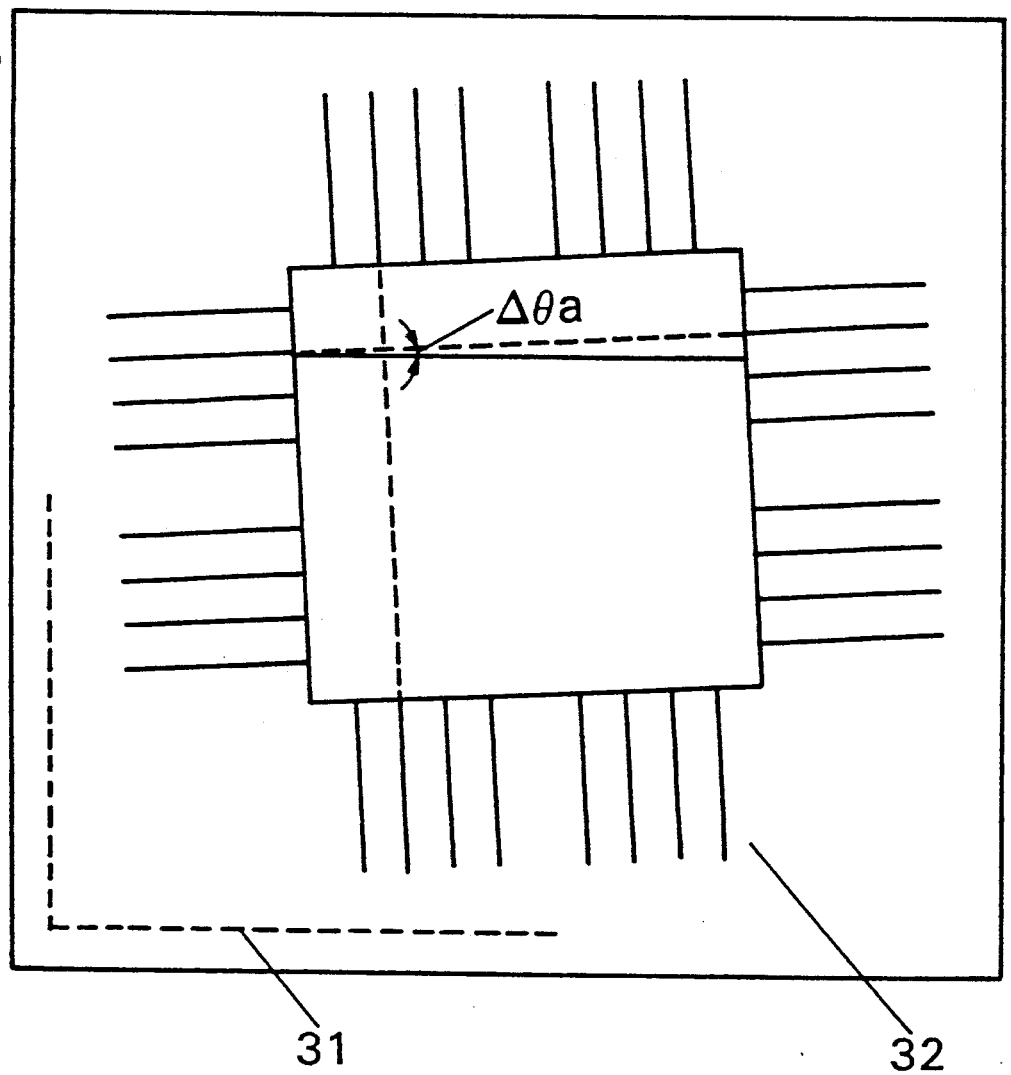
FIG. 11 shows an image of leads of an IC obtained in the conventional apparatus of FIG. 10.
Figure 12:
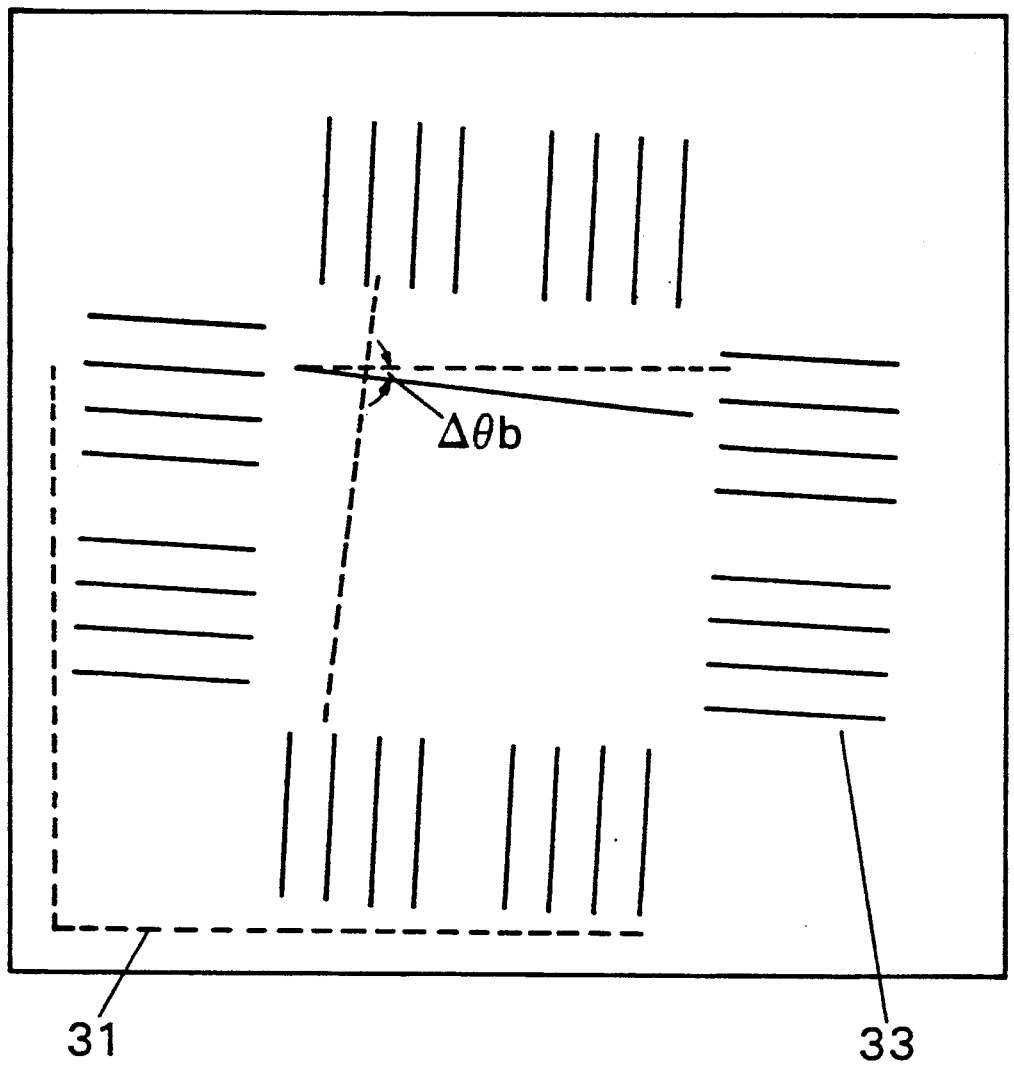
FIG. 12 shows an image of lands obtained in the conventional apparatus of FIG. 10.

When correcting the position of the IC, it is an actual key point how the rotation component is corrected. In order to accomplish this, it is best to rotate the specific shaft without interposing an offset operation of the hand. In an embodiment, therefore, the center of a group of cameras which are arranged point-symmetrically is positioned on the extension of the specific shaft of a hand of an industrial robot. In order to facilitate such an arrangment, a structure for supporting the cameras is designed so that the cameras can be adjusted in a plane and with two degrees of freedom, and a pellet which is used when adjusting the position of cameras is provided. The way of adjusting the position of two cameras in the embodiment will be described with reference to FIG. 9. First, the partial image A3 and B3 of the pellet 91 are obtained respectively by the two cameras. The characteristic values of the two images (in this case, the area of the hatched portions) are calculated, and the difference of the two characteristic values is calculated. The position of each camera is adjusted horizontally. This positional adjustment is repeated until the difference is reduced to a value smaller than a predetermined allowable value DA (FIG. 7).

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An apparatus for mounting a flat package type IC having leads on a printed circuit board having lands, comprising:
   a holding means for holding the IC, said holding means being capable of moving at least in a horizontal plane and rotating about an axis;
   a plurality of cameras each for taking an image of a part of the IC which are held by said holding means, and each for taking an image of a part of the board, said cameras being fixed to said holding means and arranged symmetrically with respect to said axis;
   a first process means for obtaining linear deviation and rotational deviation for leads from said images of the IC, and for obtaining linear deviations and rotational deviation of lands from said images of the board;
   a second process means for obtaining a linear difference between said linear deviations of the IC and board, and for obtaining a rotational difference between said rotational deviations of the IC and board; and
   an adjusting means for adjusting the position of the IC held by said holding means, by linearly moving said holding means by said linear difference, and by rotating said holding means by said rotational difference, thereby correctly positioning the leads on the corresponding lands.

2. An apparatus according to claim 1, wherein said second process means obtains said linear and rotational differences, using a statistical technique.

3. An apparatus according to claim 1, wherein said apparatus further comprises:
   a memory means for storing a previously obtained relationship between a maximum linear deviation and rotation angle of said holding means;
   a third process means for obtaining a rotation angle corresponding to the obtained linear difference, from said relationship; and a further adjusting means for repeatedly adjusting the position of the IC held by said holding means, by rotating said holding means by said rotation angle until the obtained linear difference is less than a predetermined allowable value, thereby more correctly positioning the leads on the corresponding lands.

4. A method of positioning two or more cameras symmetrically with respect to a rotation axis of a hand of a robot for mounting a flat package type IC on a printed circuit board, comprising the steps of:

(a) attaching said cameras to said hand such that said cameras are adjustably mounted on said hand;
(b) taking an image of a reference plate by two of said cameras, said two cameras being adjacent to each other;
(c) obtaining a characteristic value from each of said images;
(d) obtaining the difference between said characteristic values;
(e) adjusting the position of at least one of said two cameras; and
(f) repeating steps (b) to (e) until said difference becomes smaller than a predetermined value.

* * * * *